(12) United States Patent
Shutt et al.

(10) Patent No.: US 8,441,303 B1
(45) Date of Patent: May 14, 2013

(54) ANALOG SWITCHING SYSTEM FOR LOW CROSS-TALK

(75) Inventors: James H. Shutt, San Jose, CA (US);
Harold Kutz, San Jose, CA (US);
Timothy Williams, San Jose, CA (US);
Bruce Byrkett, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/431,801

(22) Filed: Mar. 27, 2012

Related U.S. Application Data

(63) Continuation of application No. 12/496,580, filed on Jul. 1, 2009, now Pat. No. 8,143,934.

(60) Provisional application No. 61/077,460, filed on Jul. 1, 2008.

(51) Int. Cl.
*H03K 17/00* (2006.01)

(52) U.S. Cl.
USPC ............ 327/404; 327/408; 327/436; 327/437

(58) Field of Classification Search .................. 327/404, 327/408, 436, 437
See application file for complete search history.

(56) References Cited

U.S. PATENT DOCUMENTS

| | | | |
|---|---|---|---|
| 4,061,929 A | 12/1977 | Asano | |
| 4,550,264 A * | 10/1985 | Takahaski et al. | 327/589 |
| 5,808,502 A | 9/1998 | Hui et al. | |
| 5,996,039 A * | 11/1999 | Lee | 710/316 |
| 6,198,340 B1 * | 3/2001 | Ting et al. | 327/536 |
| 6,275,395 B1 * | 8/2001 | Inn et al. | 363/60 |
| 6,320,446 B1 | 11/2001 | Podlesny et al. | |
| 6,388,469 B1 | 5/2002 | Hunt et al. | |
| 6,404,237 B1 | 6/2002 | Mathew et al. | |
| 6,901,070 B2 * | 5/2005 | Kavipurapu | 370/369 |
| 7,002,400 B2 | 2/2006 | Koo | |
| 7,005,911 B1 | 2/2006 | Om'mani | |
| 7,049,877 B2 | 5/2006 | Clara et al. | |
| 7,098,633 B1 | 8/2006 | Brokaw et al. | |
| 7,215,043 B2 * | 5/2007 | Tsai et al. | 307/130 |
| 7,319,632 B2 * | 1/2008 | Jung | 365/230.05 |
| 7,388,422 B2 | 6/2008 | Khan et al. | |
| 7,746,154 B2 | 6/2010 | Merandat et al. | |

OTHER PUBLICATIONS

U.S. Appl. No. 61/077,460: "Analog Switching System for Low Cross-Talk," James H. Shutt, filed on Jul. 1, 2008; 6 pages.
USPTO Advisory Action for U.S. Appl. No. 12/496,580 dated Jan. 11, 2012; 5 pages.
USPTO Final Rejection for U.S. Appl. No. 12/496,580 dated Mar. 22, 2011; 13 pages.
USPTO Final Rejection for U.S. Appl. No. 12/496,580 dated Nov. 3, 2011; 9 pages.
USPTO Non Final Rejection for U.S. Appl. No. 12/496,580 dated Jul. 7, 2011; 10 pages.
USPTO Non Final Rejection for U.S. Appl. No. 12/496,580 dated Nov. 18, 2010; 14 pages.
USPTO Notice of Allowance for U.S. Appl. No. 12/496,580 dated Feb. 6, 2012; 7 pages.

* cited by examiner

*Primary Examiner* — Kenneth B. Wells

(57) ABSTRACT

A system includes a voltage pump to generate a first pump voltage from an analog voltage signal. The system further includes switching pad to receive an analog signal from an external source and route the analog signal to analog processing circuitry over one or more analog signal busses based on the first pump voltage and the analog voltage signal.

20 Claims, 7 Drawing Sheets

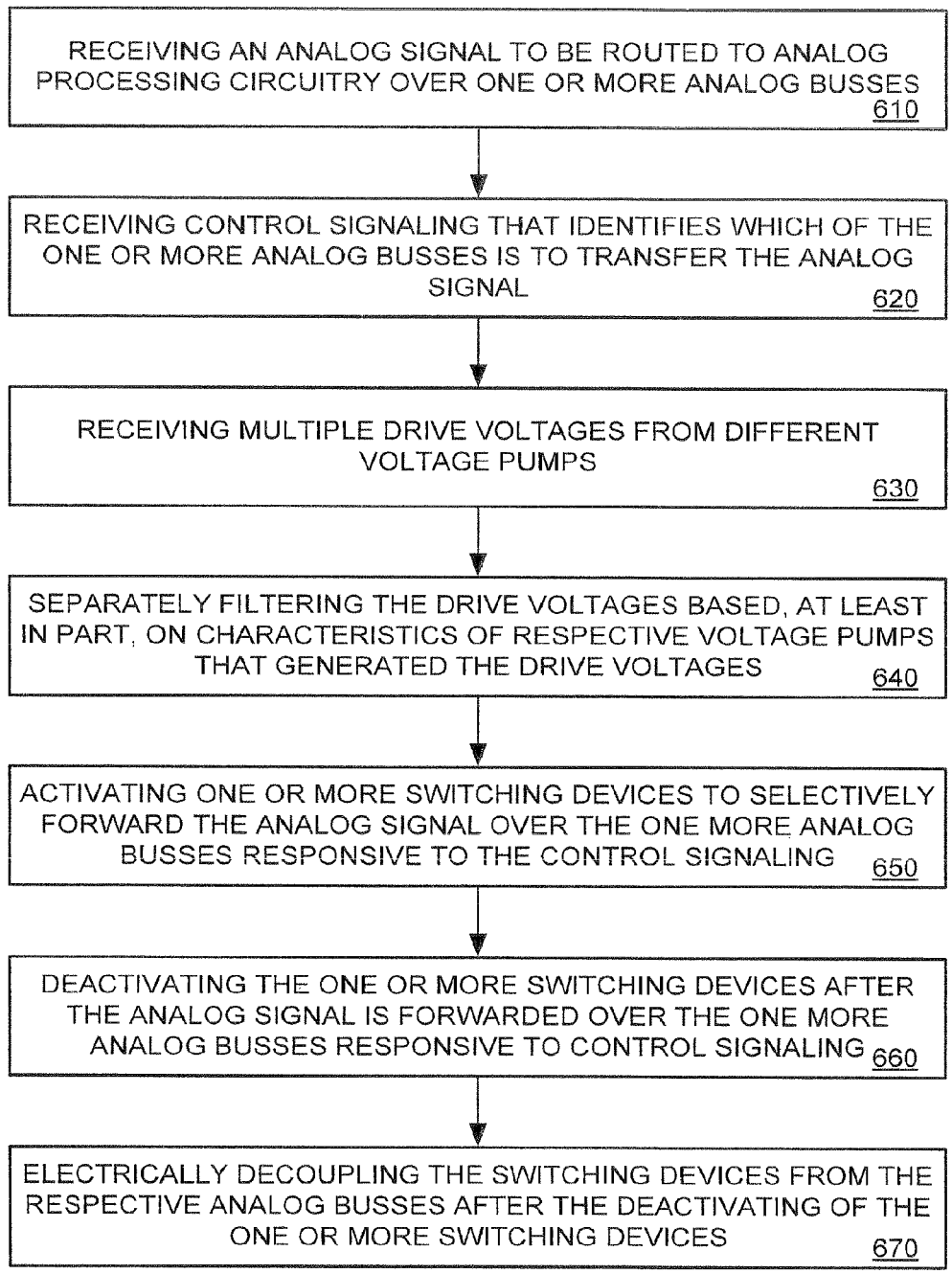

ANALOG SWITCHING SYSTEM FOR LOW CROSS-TALK

RELATED APPLICATION

This application is a continuation application of U.S. patent application Ser. No. 12/496,580 filed Jul. 1, 2009, now U.S. Pat. No. 8,143,934, issued on Mar. 27, 2012, which claims priority to the U.S. Patent Provisional Application Ser. No. 61/077,460 filed Jul. 1, 2008, both of which are hereby incorporated by reference in their entirety.

TECHNICAL FIELD

This disclosure relates generally to electronic circuits, and more particularly to analog switching systems.

BACKGROUND

Many electronic devices include analog processing circuitry, such as analog-to-digital converters or analog signal filters, which can process analog signals. These electronic devices typically receive analog signals from an external source and route them to the analog processing circuitry through an analog switching system.

Conventional analog switching systems introduce or inject noise and/or cross-talk into the analog signals while being routed to the analog processing circuitry. Although some level of noise or cross-talk can ordinarily be allowed for non-precision applications, such as a touch-screen activation signaling, when an application requires more precise analog signals, the noise and cross-talk introduced by conventional analog switching systems can be intolerable and degrade the overall performance of the electronic devices.

SUMMARY

The patent application discloses embodiments of an analog signal switching system. In some embodiments, a system includes a system includes a voltage pump to generate a first pump voltage from an analog voltage signal. The system further includes switching pad to receive an analog signal from an external source and route the analog signal to analog processing circuitry over one or more analog signal busses based on the first pump voltage and the analog voltage signal.

In some embodiments, a device includes an interface to receive analog signals to be routed to analog processing circuitry, and multiple analog switching circuits to receive the analog signals from the interface and to selectively forward the analog signal to the analog processing circuitry over respective bus lines. The one or more of the analog switching circuits can include non-overlapping circuitry to electrically decouple the one or more analog switching circuits from the respective bus lines between analog signal transfers over the respective bus lines.

In some embodiments, a method includes receiving an analog signal to be routed to analog processing circuitry over one or more analog busses, and receiving control signaling that identifies which of the one or more analog busses is to transfer the analog signal. The method further includes activating one or more switching devices to selectively forward the analog signal over the one more analog busses responsive to the control signaling, wherein each of the switching devices is driven by different voltage pumps to avoid noise from one of the analog busses being transferred to at least another bus.

DESCRIPTION OF THE DRAWINGS

FIG. 6 is an example operational flowchart for the programmable system on a chip as shown in FIGS. 1-5.

DETAILED DESCRIPTION

A programmable system on a chip (PSOC) or other electronic system can include programmable analog circuitry, such as analog-to-digital converters or analog signal filters, which can process analog signals. The programmable system on a chip includes a programmable switching system to receive analog signals from an external source and route the analog signals to the programmable analog circuitry. The programmable switching system includes various components and employs various techniques to reduce noise and cross-talk that would ordinarily be introduced into the received analog signals during routing to the programmable analog circuitry. Embodiments are shown and described below in greater detail.

Figure 1:
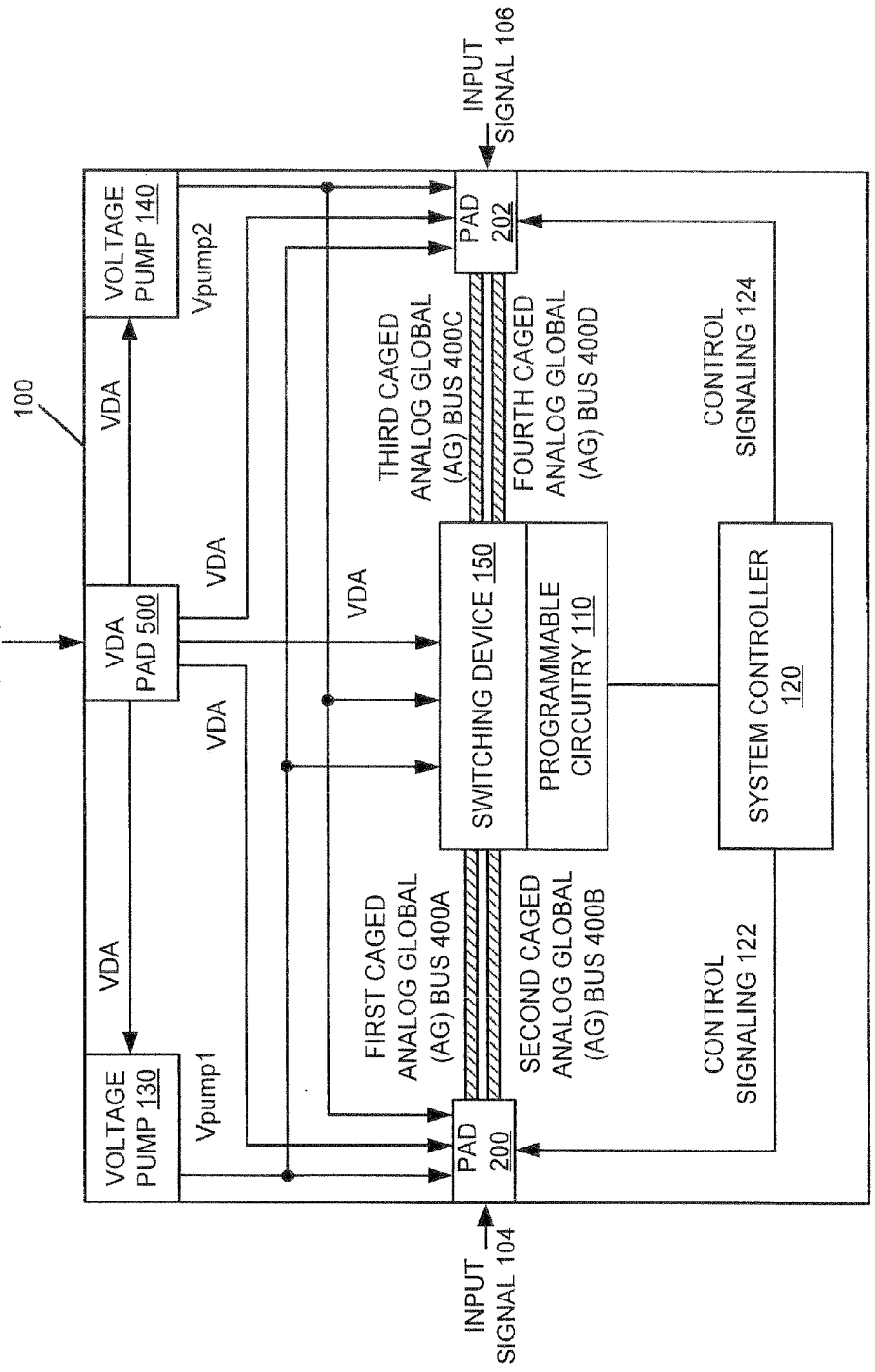
FIG. 1 is a block diagram of an example programmable system on a chip including a programmable switching system according to embodiments of the invention.

FIG. 1 is a block diagram of an example programmable system on a chip 100 including a programmable switching system according to embodiments of the invention. Referring to FIG. 1, the programmable system on a chip 100 includes programmable circuitry 110 to process analog signals for various system applications. For instance, the programmable circuitry 110 can include analog-to-digital converters, analog signal filters, bandgap reference circuitry, etc, which can be configured through commands issued by a system controller 120. The system controller 120 can be a processor coupled to a computer-readable memory storing instruction that, when executed by the processor, cause to the processor to reconfigure the operations of the programmable circuitry 110 and/or direct operations of other components in the programmable system on a chip 100. In some embodiments, the system controller 120 can be implemented as firmware or a discreet set of electrical hardware components.

The programmable system on a chip 100 includes a programmable switching system that can include multiple switching pads 200 and 202 as well as a switching device 150. The multiple programmable switching pads 200 and 202 can receive analog input signals 104 and 106, respectively, from an external source and route them to the switching device 150. The switching device 150 can then selectively forward the analog signals to the programmable circuitry 110 for performance of various processing operations. Although FIG. 1 shows two pads 200 and 202, in some embodiments, the programmable system on a chip 100 can include any number of pads, which can receive analog and/or digital signals.

The pads 200 and 202 and switching device 150, when directed by the system controller 120, e.g., through control signaling 122 and 124, can route or forward the received analog input signals 104 and 106 to the programmable circuitry 110. In some embodiments, the pad 200 can connect to at least two busses, for example, a first caged analog global (AG) bus 400A and a second caged AG bus 400B, and the pad 202 can connect to at least two busses, for example, a third caged AG bus 400C and a fourth caged AG bus 400D, available for routing the analog signal to programmable circuitry 110. The pads 200 and 202 can switch and forward the analog input signals 104 and 106, respectively, onto any of the available busses 400A-D at the direction of the system controller 120. As will be discussed below in greater detail, the use of caged bus routing helps to reduce cross-talk between busses or with other electrical components in the programmable system on a chip 100.

The programmable system on a chip 100 includes an analog voltage (VDA) pad 500 to receive an external analog voltage VDA 102, which can be used to power various other on-chip electrical components. For instance, the VDA pad 500 can route analog voltage VDA to a voltage pump 130, route analog voltage VDA to pad 200, route analog voltage VDA to switching device 150, route analog voltage VDA to pad 202, and route analog voltage VDA to a voltage pump 140. Although not shown in FIG. 1, the VDA pad 500 can also route the analog voltage VDA to the programmable circuitry 110 and the system controller 120.

In some embodiments, the VDA pad 500 can be configured in a star-configuration, which allows the VDA pad 500 to independently route the analog voltage VDA to the various on-chip components. By separating the routing of the analog voltage VDA, the VDA pad 500 can eliminate cross-talk that could have been introduced to a shared supply voltage line and propagated to other on-chip components. Also, since the use of shared supply routing can increase a voltage drop of the analog voltage VDA as it is routed to the various on-chip components, for example, due to the aggregate current draw for all of the components receiving a shared supply voltage, the separation of the analog voltages VDA routed to the on-chip components allows for a more consistent and higher level of voltage to drive the components. Embodiments of the VDA pad 500 will be described below in greater detail.

The programmable system on a chip 100 includes multiple voltage pumps 130 and 140 to generate pump voltages Vpump1 and Vpump2, respectively. The voltage pumps 130 and 140 can provide the pump voltages Vpump1 and Vpump2 to the pads 200 and 202 and the switching device 160 for use in the switching and routing of the analog input signals 104 and 106, respectively, to the programmable circuitry 110. In some embodiments, the pads 200 and 202 can have separate switching circuitry for each of the caged busses 400, and can be driven by different pump voltage Vpump1 or Vpump2. This separation of switching circuitry can help ensure noise present on one of the busses does not get transferred to the other bus via a voltage pump 130 or 140.

Figure 2:
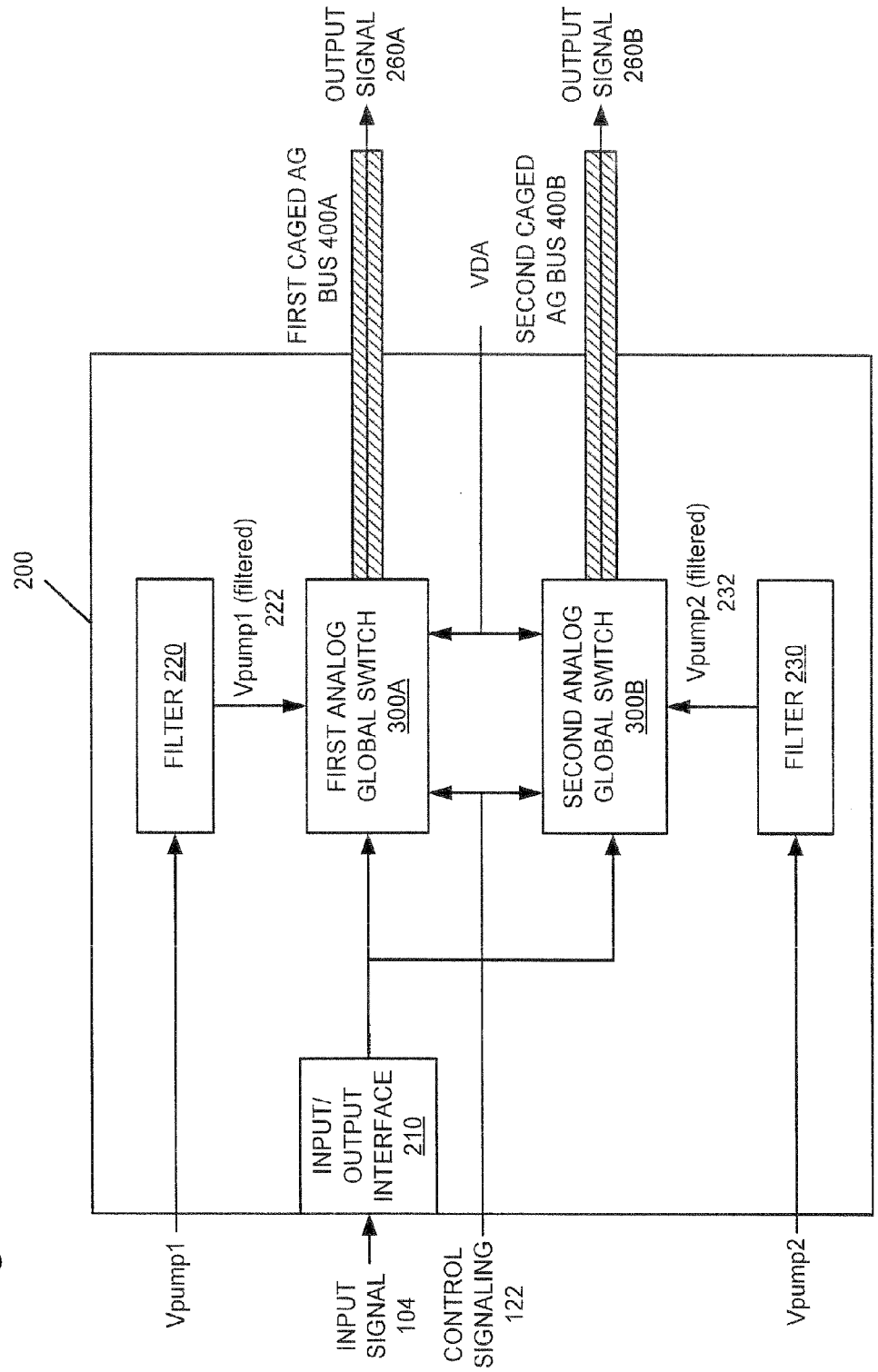
FIG. 2 is a block diagram of an example programmable switching pad shown in FIG. 1.

FIG. 2 is a block diagram of an example programmable switching pad 200 shown in FIG. 1. Referring to FIG. 2, the pad 200 includes an input/output interface 210 to receive analog input signal 104 from an external source (not shown). The input/output interface 210 forwards the analog input signal 104 to a first analog global switch 300A and a second analog global switch 3009. The first analog global switch 300A is coupled to the first caged AG bus 400A, and can forward the analog input signal 104 over the first caged AG bus 400A as output signal 260A responsive to control signaling 122 from a system controller 120. The second AG switch 300B is coupled to the second caged AG bus 400B, and can forward the analog input signal 104 over the second caged AG bus 400B as output signal 260B responsive to control signaling 122 from a system controller 120. In some embodiments, the first caged AG bus 400A is a quiet bus that is used to transfer data signals for precision applications, while the second caged bus 400B can be considered a noisy bus that can be used to transfer any signal to the programmable circuitry 110.

The pad 200 receives three different voltages, the analog voltage VDA from the VDA pad 500, pump voltage Vpump1 from the voltage pump 130, and pump voltage Vpump2 from the voltage pump 140. In some embodiments, the analog voltage VDA is provided to both the first AG switch 300A and the second AG switch 300B, while the pump voltage Vpump1 is provide to the first AG switch 300A via a filter 220, and the pump voltage Vpump2 is provide to the second AG switch 300B via a filter 230.

The filter 220 is configured to receive pump voltage Vpump1 from the voltage pump 130 and filters the pump voltage Vpump1 for presentation to the first AG switch 300A. In some embodiments, the filter 220 can be configured to remove noise from the pump voltage Vpump1 that was introduced by the voltage pump 130. For example, the filter 220 can be a bypass capacitor or resister-capacitor (RC) filter configured to remove frequency components introduced by the voltage pump 130 during the generation of the pump voltage Vpump1 from the analog voltage VDA. The filter 220 can also be configured to remove noise introduced to the pump voltage Vpump1 during the routing from the voltage pump 130 to the pad 200.

The filter 230 is configured to receive pump voltage Vpump2 from the voltage pump 140 and filters the pump voltage Vpump2 for presentation to the second AG switch 300B. In some embodiments, the filter 230 can be configured to remove noise from the pump voltage Vpump2 that was introduced by the voltage pump 140. For example, the filter 230 can be a bypass capacitor or resister-capacitor (RC) filter configured to remove frequency components introduced by the voltage pump 140 during the generation of the pump voltage Vpump2 from the analog voltage VDA. The filter 230 can also be configured to remove noise introduced to the pump voltage Vpump2 during the routing from the voltage pump 140 to the pad 200.

In some embodiments, each pad in the system on a chip 100 can include the same or similar filters as pad 200, which allows for effect removal of noise introduced by the voltage pumps 130 and 140. The distribution of the filters to the respective pads also allows the programmable system on a chip 100 the flexibility to remove noise introduced by routing the pump voltages to the respective pads.

Since the first AG switch 300A and the second AG switch 300B receive separate and independent pump voltages Vpump1 and Vpump2 (or voltages 222 and 232 after filtering), the pad 200 reduces the ability of noise from one of the caged AG busses 400A or 400B to propagate to the other bus 400A or 400B. For instance, if both of the AG switches 300A and 300B received the same pump voltage, it is possible that noise from one AG bus 400A or 400B could propagate to the other bus via the shared pump voltage and the shared voltage pump.

Figure 3:
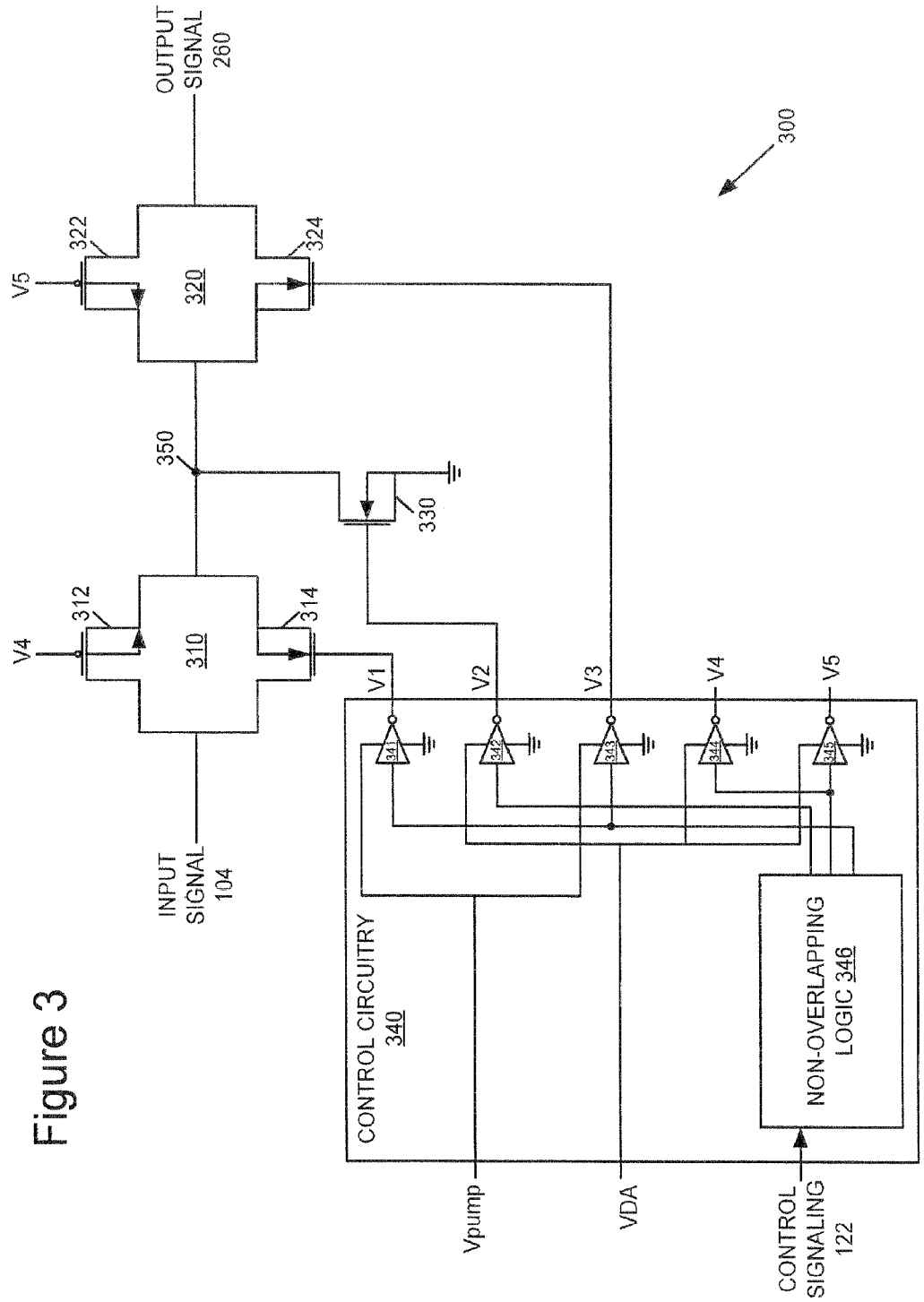
FIG. 3 is a block diagram of an example switch that can be included in the programmable switching pad shown in FIGS. 1 and 2.

FIG. 3 is a block diagram of an example switch 300 that can be included in the programmable switching pad 200 shown in FIGS. 1 and 2. Referring to FIG. 3, the switch 300 includes a field-effect transistor (FET) based T-switch configuration to route the analog input signal 104 received from the input/output interface 210 of the programmable switching pad 200 to a caged AG bus 400A or 400B that corresponds to the switch 300. The switch 300 also includes control circuitry 340 to direct the operations of the T-switch that route the analog signal 104.

The control circuitry 340 includes multiple inverters 341-345 to provide various activation signals or voltages V1-V5, respectively, to the T-switch. The inverters 341-345 can select between a high voltage, which can be a pump voltage Vpump or the analog voltage VDA, and a ground voltage based on signaling from non-overlapping logic 346. For instance, inverters 341 and 343 can receive the pump voltage Vpump1 or Vpump2, while the other inverters 342 and 344-345 can receive the analog voltage VDA. The selection between the high voltage and ground for each activation signal can direct the T-switch to operate in different operational states.

The T-switch includes a pair of circuit switches 310 and 320 coupled at a node 350, which can bidirectionally transfer signals between their respective inputs and outputs. The T-switch also includes a decoupling circuit 330 to pull node 350 to a ground voltage when the T-switch is electrically decoupled from the caged AG bus 400A or 400B. This decoupling helps to ensure that noise present on the bus is not propagated back into the pad, or that noise in the pad is not propagated onto the caged bus 400A or 400B.

The circuit switch 310 can include a PMOS transistor 312 which is source-drain coupled with an NMOS transistor 314. The PMOS transistor 312 can receive a voltage V4 at a gate from the control circuitry 340, and NMOS transistor 314 can receive a voltage V1 at a gate from the control circuitry. In some embodiments, the voltage V4 can be set to either a ground voltage or to the pump voltage Vpump, while the voltage V1 can be set to either a ground voltage or to the analog voltage VDA. In operation, the voltages V1 and V4 can be set to turn-on the circuit switch 310 and pass the analog input signal 104 to circuit switch 320 through node 350, or set to turn-off the circuit switch 310 and not allow voltage to pass over the circuit switch 310.

The circuit switch 320 can include a PMOS transistor 322 which is source-drain coupled with an NMOS transistor 324. The PMOS transistor 322 can receive a voltage V5 at a gate from the control circuitry 340, and NMOS transistor 324 can receive a voltage V3 at a gate from the control circuitry. In some embodiments, the voltage V5 can be set to either a ground voltage or to the pump voltage Vpump, while the voltage V3 can be set to either a ground voltage or to the analog voltage VDA. In operation, the voltages V3 and V5 can be set to turn-on the circuit switch 320 and output the analog input signal 104 received from circuit switch 310 over the caged AG bus 400A or 400B, or set to turn-off the circuit switch 320 and not allow voltage to pass over the circuit switch 320.

The decoupling circuitry 330 can include an NMOS transistor with a drain coupled to node 350, a source coupled to ground, and a gate coupled to voltage V2. In some embodiments, the voltage V2 can be set to either a ground voltage or to the analog voltage VDA. In operation, the voltage V2 can be set to turn-on the NMOS transistor and pull node 350 to a ground voltage, effectively discharging any voltage on node 350. The voltage V2 can be set to turn-off the NMOS transistor, allowing the switches 310 and 320 to pass data signals to each other.

The non-overlapping logic 346 of the control circuitry 340 can receive control signaling 122 from the system controller 120 and coordinate the selection of the various activation signals V1-V5 outputted from the inverters 341-345. The non-overlapping logic 346 can also delay turning on the decoupling circuit 330 until after both switches 310 and 320 are turned off, to help ensure that there are no glitches on the signal through the T-switch.

As discussed above, activation signals or voltages V4 and V5 are provided to circuit switches 310 and 320 with either a voltage level of a ground voltage or a pump voltage Vpump. Since it is possible that a capacitance between the output signal 260 and the gate of the PMOS transistors 322 can alter the voltage level of the gate or the output signal 260, and that a capacitance between the input signal 104 and the gate of the PMOS transistors 312 can alter the voltage level of the gate or the input signal 104, in some embodiments, the control circuitry 340 provides separate and independent signals V4 and V5 to the gates of the two PMOS transistors 312 and 322. In other words, due to the characteristics of the PMOS transistors 312 and 322, by providing separate signals V4 and V5 to their respective gates, the T-switch can avoid noise from being introduced into the input signal 104 or the output signal 260.

Figure 4A:
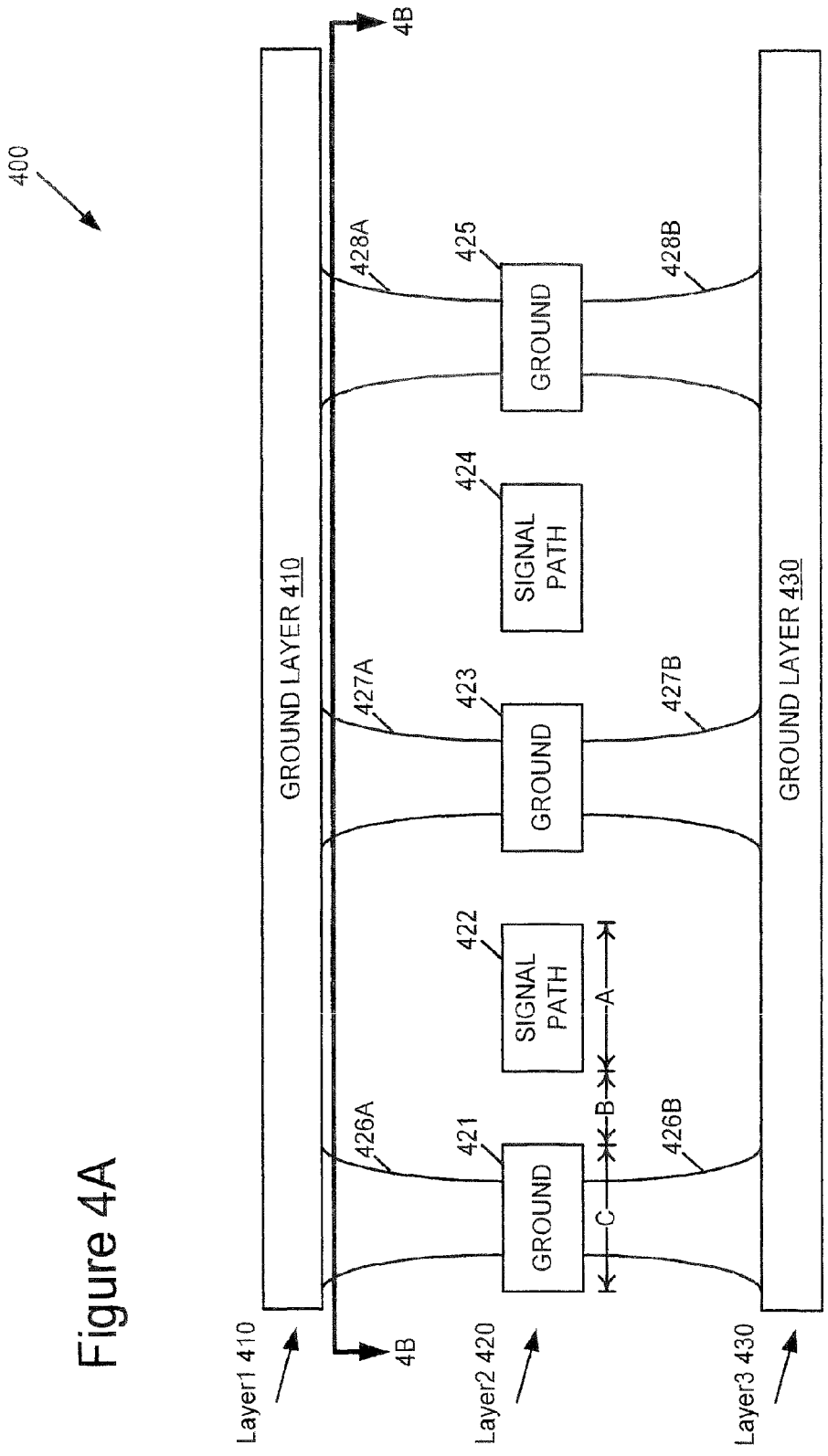
FIGS. 4A and 4B are block diagrams illustrating examples of caged bus routing shown in FIGS. 1 and 2.
Figure 4B:
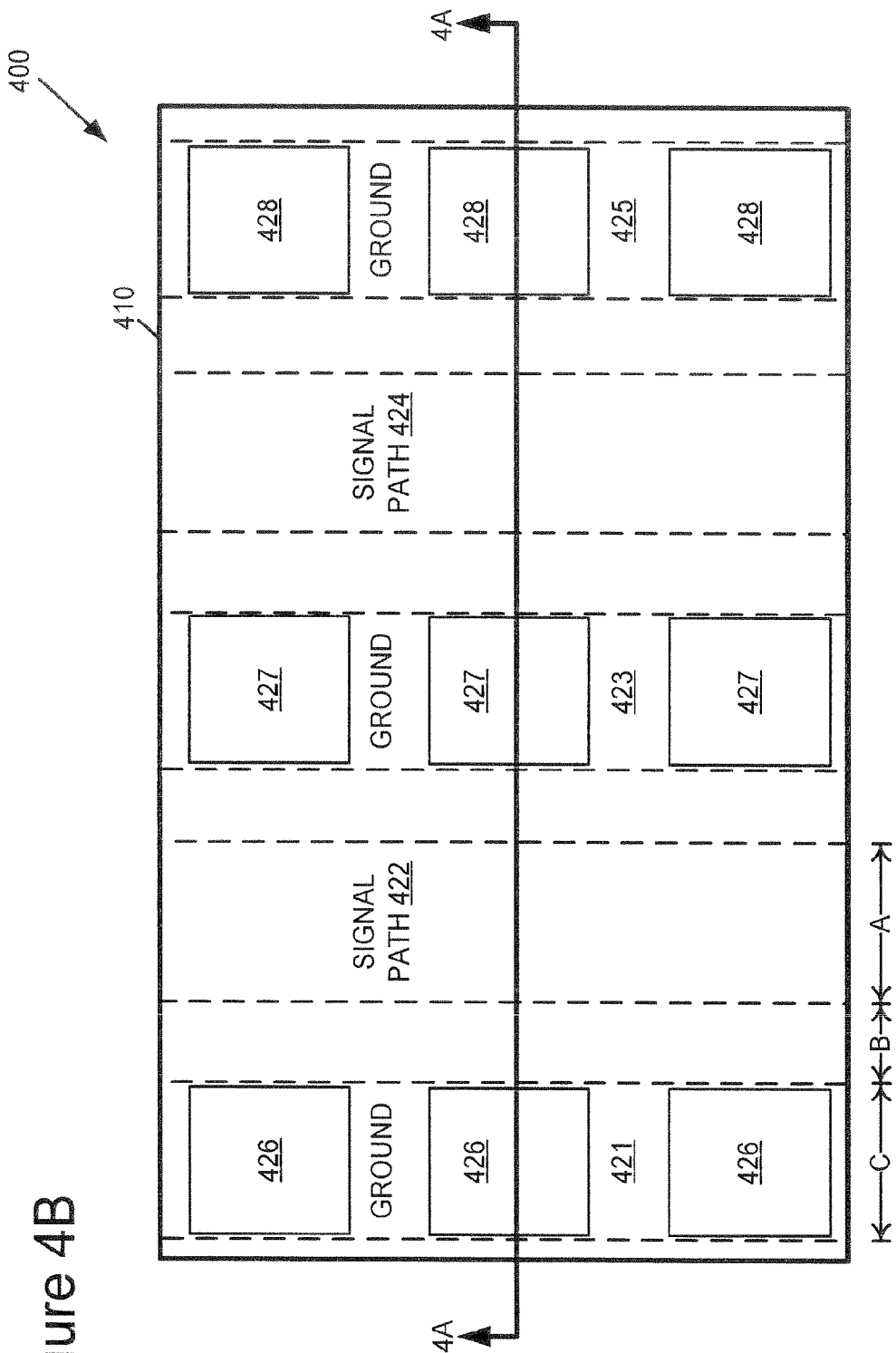

FIGS. 4A and 4B are block diagrams illustrating examples of caged bus routing shown in FIGS. 1 and 2. Referring to FIG. 4A, a cross-sectional view of a caged bus route 400 is shown. The caged bus route 400 includes multiple signal paths 422 and 424 which can carry the analog signals 104 or 106 from the pads 200 and 202 to the switching device 160. The signal paths 422 and 424 can be substantially surrounded by grounding components, such as ground layer 410, ground layer 430, ground paths 421, 423, and 425, and corresponding vias 426A-B, 427A-B, and 428A-B. By substantially surrounding the signal paths 422 and 424 with grounding components, cross-talk between the signal paths 422 and 424 and noise infiltration can be reduced.

The caged bus route 400 has three main layers, a signal path layer 420 located in between two grounding layers 410 and 430. The signal path layer 420 is configured to interleave signal paths 422 and 424 with ground paths 421, 423, and 425. The caged bus route 400 can include grounding vias 426A-426B, 427A-B, and 428A-B located in between the signal path layer 420 and the ground layers 410 and 430 and over the ground paths 421, 423, and 425. In some embodiments, these grounding vias can be arranged in a picket fence configuration. The picket fence configuration is shown in FIG. 4B, which illustrates a top-view of the caged bus route 400.

Although the addition of grounding components substantially reduces cross-talk and noise, the signal path layer 420 can be variously configured to trade-off the remaining noise and cross-talk for particular applications. For example, a size of a signal path, shown as "A", a distance between a signal path and a ground path, shown as "B", and a size of a ground path, shown as "C" can be configured or optimized to trade-off cross-talk between the signal paths, as well as noise and signal integrity due to parasitic resistance and/or parasitic capacitance.

Figure 5:
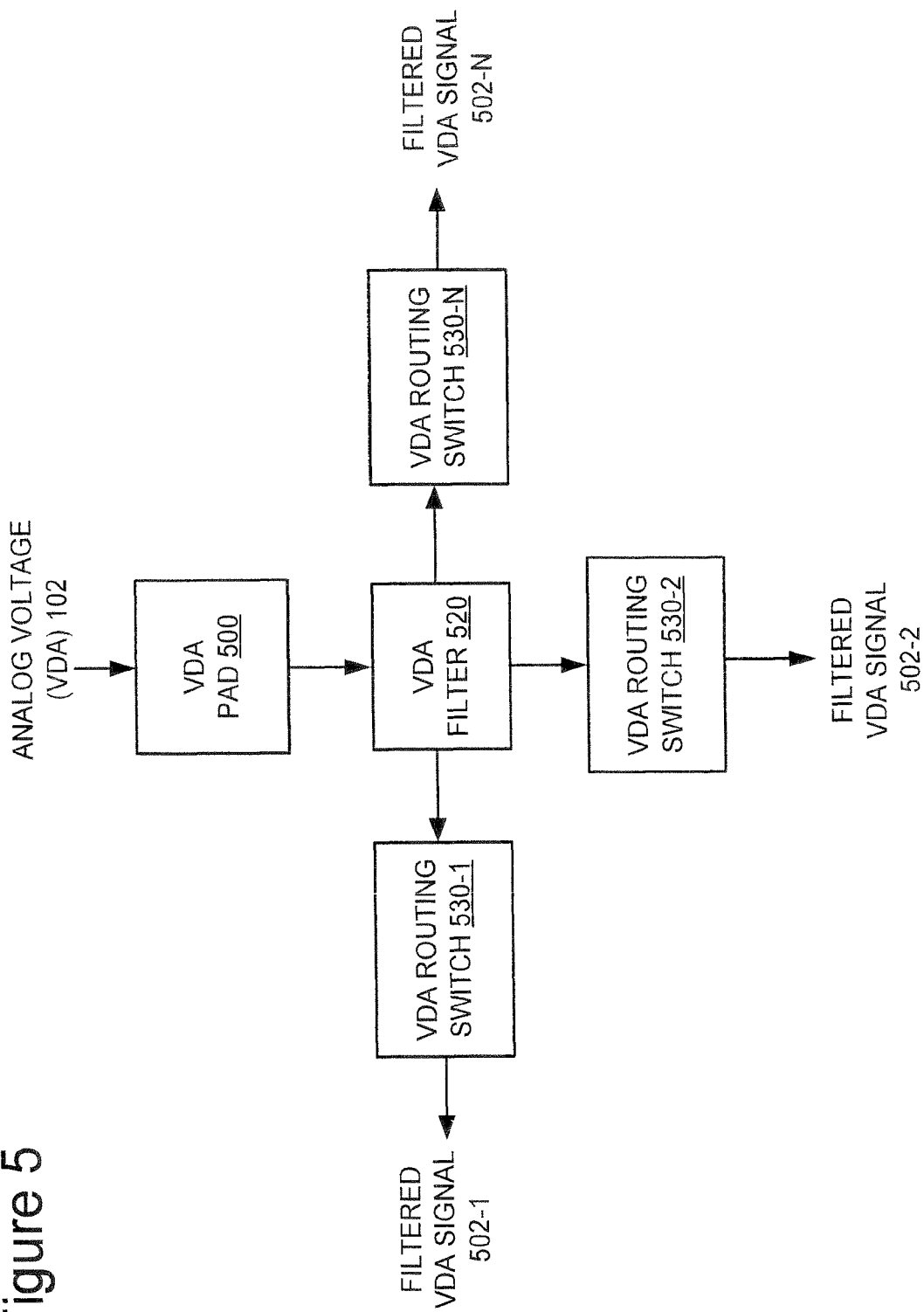
FIG. 5 is a block diagram of an example analog voltage (VDA) pad according to embodiments of the invention.

FIG. 5 is a block diagram of an example analog voltage (VDA) pad 500 according to embodiments of the invention. According to FIG. 5, the VDA pad 500 can receive the VDA voltage 102 and provide the VDA voltage 102 to a VDA filter 520. The VDA filter 520 can filter or remove at least a portion of noise on the VDA voltage 102. For instance, the VDA voltage 102 can include high frequency components that were introduced during generation off-chip, which can be removed or reduced by the VDA filter 520. The VDA filter 520 can also remove or reduce noise that is introduced to the VDA voltage 102 during routing to the VDA pad 500.

The VDA filter 520 can provide a filtered VDA voltage to multiple VDA routing paths 530-1 to 530-N that are arranged in a star-configuration. The star-configuration allows the VDA pad 500 to output filtered VDA signals 502-1 to 502-N to various on-chip components over separate and independent routing lines. By separating the transmission of the filtered VDA signals 502 over independent routing lines, the VDA pad 500 in combination with the VDA filter 520 and the multiple VDA routing paths 530-1 to 530-N can eliminate cross-talk that could have been introduced to a shared supply route line and propagated to other on-chip components. Also, since the use of a shared supply route can increase a voltage drop of the analog voltage VDA as it is routed to the various on-chip components, for example, due to the aggregate current draw for all of the components receiving a shared supply voltage, the separation of the filtered VDA route 502 to the on-chip components allows for a more consistent and higher level of voltage to drive the components.

FIG. 6 is an example operational flowchart for the programmable system on a chip as shown in FIGS. 1-5. Referring to FIG. 6, in a block 610, the programmable switching system is configured to receive an analog signal to be routed to analog processing circuitry over one or more analog busses. The analog signal can be received from an off-chip source that is providing the analog signals to the programmable system on a chip 100 for analog processing.

In a block 620, the programmable switching system is configured to receive control signaling that identifies which of the one or more analog busses is to transfer the analog signal. The control signaling can be generated and provided to the programmable switching system by a system controller. The control signaling can be an on/off signal that indicates to the programmable switching which switches should be allowed to pass the analog signal to the processing circuitry over their particular analog busses.

In a block 630, the programmable switching system is configured to receive multiple drive voltages from different voltage pumps. As discussed above, the use of multiple drive voltages can be used for different switches within the programmable switching system to cross-talk between multiple busses.

In a block 640, the programmable switching system is configured to separately filter the drive voltages received from the different voltage pumps based, at least in part, on characteristics of respective voltage pumps that generated the drive voltages. In some embodiments, the drive voltages can include high frequency components that were introduced by the voltage pumps during generation, which are undesirable. The separate filtering of the drive voltages can remove these high frequency components, as well as remove noise introduced during routing between the voltage pumps and the programmable switching system.

In a block 650, the programmable switching system is configured to activate one or more switching devices to selectively forward the analog signal over the one more analog busses responsive to the control signaling. In a block 660, the programmable switching system is configured to deactivate the one or more switching devices after the analog signal is forwarded over the one more analog busses responsive to control signaling.

In a block 670, the programmable switching system is configured to electrically decouple the switching devices from the respective analog busses after the deactivating of the one or more switching devices. The programmable switching system includes distributed non-overlap logic that sequences the local switching operations of individual switches in programmable switching system. This allows for the system controller to issue control signaling that provides a high-level on/off decision regarding the transfer of analog signals over a bus line, without having to micro-manage the actual sequence of the switching operations to ensure that the switching system does not have signal transfer overlap.

One of skill in the art will recognize that the concepts taught herein can be tailored to a particular application in many other ways. In particular, those skilled in the art will recognize that the illustrated embodiments are but one of many alternative implementations that will become apparent upon reading this disclosure.

The preceding embodiments are examples. Although the specification may refer to "an", "one", "another", or "some" embodiment(s) in several locations, this does not necessarily mean that each such reference is to the same embodiment(s), or that the feature only applies to a single embodiment.

The invention claimed is:

1. A system comprising:
a first voltage generator to generate a first voltage from a voltage supply signal, wherein the first voltage is configured to provide a continuously different value than the voltage supply signal; and
a second voltage generator to generate a second voltage, wherein the second voltage is configured to provide a continuously different value than both the voltage supply signal and the first voltage; and
a switching interface to receive an analog input signal from an external source and route the analog input signal to analog processing circuitry over one or more of a plurality of analog signal busses, wherein the switching interface includes a first switch circuit controlled by the first voltage to route the analog input signal onto a first analog signal bus of the plurality of analog signal busses, and includes a second switch circuit controlled by the second voltage to route the analog input signal onto a second analog signal bus of the plurality of analog signal busses.

2. The system of claim 1, wherein the first switch circuit comprises a transistor where a gate terminal of the transistor is controlled by the first voltage.

3. The system of claim 1, wherein at least one of the first switch circuit and the second switch circuit comprises a field-effect transistor (FET) based T-switch having a first switch to receive the analog input signal and a second switch to output the analog input signal to the first analog signal bus or the second analog signal bus.

4. The system of claim 1, wherein when the switching interface routes the analog input signal over the first analog signal bus, noise present on the second analog signal bus is not transferred between the analog signal busses through the first voltage generator and the second voltage generator, due, at least in part, to an electrical isolation of the first voltage and the second voltage.

5. The system of claim 1, wherein the switching interface comprises a first filter to remove a high frequency portion of the first voltage introduced by the first voltage generator, and comprises a second filter to remove a high frequency portion of the second voltage introduced by the second voltage generator.

6. The system of claim 1, further comprising a voltage interface configured in a star-type configuration to transmit the voltage supply signal to the first voltage generator and the second voltage generator over physically isolated routes.

7. The system of claim 1, wherein the switching interface includes circuitry to generate activation signals that coordinate signal switching operations of the switching interface and to prevent the routing of analog signals to at least one of the plurality of analog signal busses between signal switching operations.

8. The system of claim 1, wherein at least one of the plurality of analog signal busses is electrically caged to avoid cross-talk between the plurality of analog signal busses.

9. The system of claim 1, wherein the at least one of the plurality of analog signal busses includes multiple grounding components that substantially surround a signal path that transfers the analog input signal to the analog processing circuitry.

10. A device comprising:
- a first voltage generator;
- a second voltage generator; and
- multiple analog switching circuits, coupled to the first and second voltage generators, to receive an analog input signal to be routed to analog processing circuitry and to selectively forward the analog input signal to the analog processing circuitry over respective bus lines, wherein one or more of the multiple analog switching circuits include circuitry to electrically decouple the one or more analog switching circuits from the respective bus lines based on electrically separate voltages to reduce an injection of noise from one bus line to another bus line, wherein the electrically separate voltages are generated by the first voltage generator and the second voltage generator from a voltage supply signal, and wherein the electrically separate voltages are configured to provide continuously different values than the voltage supply signal and than one another.

11. The device of claim 10, wherein the multiple analog switching circuits comprise transistors where gate terminals of the transistor are controlled by the electrically separate voltages.

12. The device of claim 10, further comprising multiple distributed voltage filters to independently filter the voltages based, at least in part, on characteristics of the respective voltage generators that generated the voltages.

13. The device of claim 10, wherein at least one of the analog switching circuits comprises:
- a field-effect transistor (FET) based T-switch having a first switch to receive the analog input signal and a second switch to output the analog input signal to the respective bus line; and
- a controller to generate activation signals that coordinate the transfer of the analog input signal from the first switch to the respective bus line.

14. The device of claim 13, wherein the field-effect transistor based T-switch is configured to prevent the routing of analog signs to the at least one of the analog switching circuits from the respective bus line in response to the activation signals.

15. The device of claim 10, wherein the controller is configured to provide separate activation signals to inputs of the first switch and the second switch to avoid transferring noise from the bus line to the first switch through the controller.

16. A method comprising:
- receiving an analog input signal to be routed to analog processing circuitry over a plurality of analog busses;
- receiving control signaling that identifies which of the plurality of analog busses is to transfer the analog input signal; and
- activating one or more switching devices to selectively forward the analog input signal over the plurality of analog busses responsive to the control signaling, wherein each of the switching devices is controlled by a drive voltage from a voltage generator to avoid noise from one of the plurality of analog busses being transferred to at least another bus of the plurality of analog busses, the voltage generator to generate different drive voltages from a voltage supply signal, and wherein the drive voltages are configured to provide continuously different values than the voltage supply signal and than one another.

17. The method of claim 16, further comprising:
- deactivating the one or more switching devices after the analog input signal is forwarded over the plurality of analog busses responsive to the control signaling, wherein the switching devices comprise transistors where gate terminals of the transistors are controlled by the drive voltages; and
- preventing the routing of analog signals to the respective analog busses after the deactivating of the one or more switching devices.

18. The method of claim 16, further comprising separately filtering the drive voltages received from the voltage generator based, at least in part, on characteristics of the voltage generator that generated the drive voltages.

19. The method of claim 16, wherein at least one of the plurality of analog busses is electrically caged to avoid crosstalk between the plurality of analog busses, wherein the at least one of the electrically caged analog busses include a signal path to transfer the analog input signal to the analog processing circuitry which is substantially surrounded by multiple grounding components.

20. The method of claim 16, wherein when forwarding the analog input signal over a first analog bus of the plurality of analog busses, noise present on a second analog bus is not transferred to the first analog bus through the voltage generator due, at least in part, to an electrical isolation of the drive voltages generated by the voltage generator.

* * * * *